United States Patent
Fu et al.

(10) Patent No.: US 7,545,111 B2
(45) Date of Patent: Jun. 9, 2009

(54) TESTING INVERTER DRIVEN ELECTRIC MOTOR SHUT-OFF PATH

(75) Inventors: Zhenxing Fu, Ann Arbor, MI (US); Marcus Heller, Farmington Hills, MI (US)

(73) Assignees: Chrysler LLC, Auburn Hills, MI (US); GM Global Technology Operations, Detroit, MI (US); Daimler AG, Stuttgart (DE); Bayerische Motoren Werke Aktiengesellschaft, Munich (DE)

( * ) Notice: Subject to any disclaimer, the term of this patent is extended or adjusted under 35 U.S.C. 154(b) by 236 days.

(21) Appl. No.: 11/615,126

(22) Filed: Dec. 22, 2006

(65) Prior Publication Data

US 2008/0150573 A1 Jun. 26, 2008

(51) Int. Cl.
*H02P 6/10* (2006.01)

(52) U.S. Cl. .................. 318/400.23; 318/276; 318/434; 318/400.28; 324/767

(58) Field of Classification Search ................. 318/434, 318/439, 400.23, 400.28, 806; 324/767, 324/158.1; 702/84
See application file for complete search history.

(56) References Cited

U.S. PATENT DOCUMENTS

| | | | | |
|---|---|---|---|---|
| 4,307,342 A | * | 12/1981 | Peterson | .................. 324/767 |
| 4,744,041 A | * | 5/1988 | Strunk et al. | ................. 702/84 |
| 5,457,364 A | * | 10/1995 | Bilotti et al. | ................. 318/434 |
| 5,481,171 A | * | 1/1996 | Woginrich, Jr. | ............. 318/778 |
| 6,078,173 A | * | 6/2000 | Kumar et al. | ............. 324/158.1 |
| 6,688,411 B2 | | 2/2004 | Boggs et al. | |
| 6,759,820 B2 | * | 7/2004 | Karwath | ................. 318/400.23 |
| 6,906,485 B2 | * | 6/2005 | Hussein | ................. 318/400.28 |
| 7,339,803 B2 | * | 3/2008 | Nojima | ................. 363/37 |
| 7,400,103 B2 | * | 7/2008 | Hofer | ................. 318/276 |
| 2003/0102834 A1 | * | 6/2003 | Hussein | ................. 318/439 |
| 2004/0201945 A1 | * | 10/2004 | Dovheim | ................. 361/160 |
| 2005/0256618 A1 | | 11/2005 | Hsieh et al. | |
| 2007/0252587 A1 | * | 11/2007 | Stauder et al. | ................. 324/207.15 |
| 2008/0150573 A1 | * | 6/2008 | Fu et al. | ................. 324/772 |
| 2008/0218119 A1 | * | 9/2008 | Cyran et al. | ................. 318/806 |

OTHER PUBLICATIONS

Asano H et al: "An estimation method of starting performance of squirrel-cage induction motor on DC decay testing method" Industry Applications Conference, 1999. Thirty-Fourth IAS Annual Meeting. Conference Record of the 1999 IEEE Phoenix, AZ, USA Oct. 3-7, 1999, Piscataway, NJ, USA, IEEE, US. vol. 3, Oct. 3, 1999, pp. 1559-1564, XP010355118 ISBN: 978-0-7803-5589-7 the whole document.

* cited by examiner

*Primary Examiner*—Paul Ip
(74) *Attorney, Agent, or Firm*—Ralph E. Smith

(57) ABSTRACT

A method for testing electric motor shut-off including injecting current into an electric motor, applying at least one of a short or an open to the electric motor for a predetermined length of time, calculating the rate of decay of the current and comparing rate of the decay with a predetermined decay criteria. In one implementation, a predefined sequence of opening and short circuiting the electric motor is used, and the shut-off path tests for the motor three phases can be verified with one test.

20 Claims, 3 Drawing Sheets

US 7,545,111 B2

TESTING INVERTER DRIVEN ELECTRIC MOTOR SHUT-OFF PATH

FIELD OF THE INVENTION

The invention relates generally to vehicle powertrains and more particularly to hybrid-electric vehicle powertrains.

BACKGROUND OF THE INVENTION

Hybrid electric vehicles generally use powertrain architecture that combine internal-combustion engines and batteries that power electric traction motors for propulsion. When vehicle speeds are low, vehicles are typically in a pure electric propulsion mode. When the vehicle speeds are high enough, internal-combustion engines are excited, and the electric traction motors can be actuated providing a torque boost to the driveline, charge to the main battery, driveline synchronization during gear shifts, and/or driveline active damping to improve driver feel. As commonly known, considerable improvements in fuel economy and emission reductions are achievable using hybrid electric vehicles.

As in any other physical systems, faults may occur during the operation of electric traction motor drives. Hence, it may be necessary to check the electric motor shut-off path effectiveness for each driving cycle. When ensuring that a motor shut off mechanism operates correctly, it is conventionally necessary to spin the electric motor. The motor is spun and the current induced by the moving magnets or windings can be measured. However, at the vehicle startup, spinning the motor for torque shutoff path check may be impossible in some instances, requires time and can cause audible noise that concerns drivers.

SUMMARY OF THE INVENTION

A method for testing electric traction motor shut-off paths includes the steps of injecting currents into a three-phase electric motor, applying at least one of a short or an open to the three-phase electric motor for a predetermined length of time, calculating a rate of decay of the current, and then comparing the decay with predetermined decay criteria. In one implementation, a predefined sequence of opening and short circuiting the electric motor is used, and the shut-off path tests for the motor three phases can be verified with one test.

BRIEF DESCRIPTION OF THE DRAWINGS

The following detailed description of preferred embodiments and best mode will be set forth with reference to the accompanying drawings, in which.

DETAILED DESCRIPTION OF PREFERRED EMBODIMENTS

Figure 1:
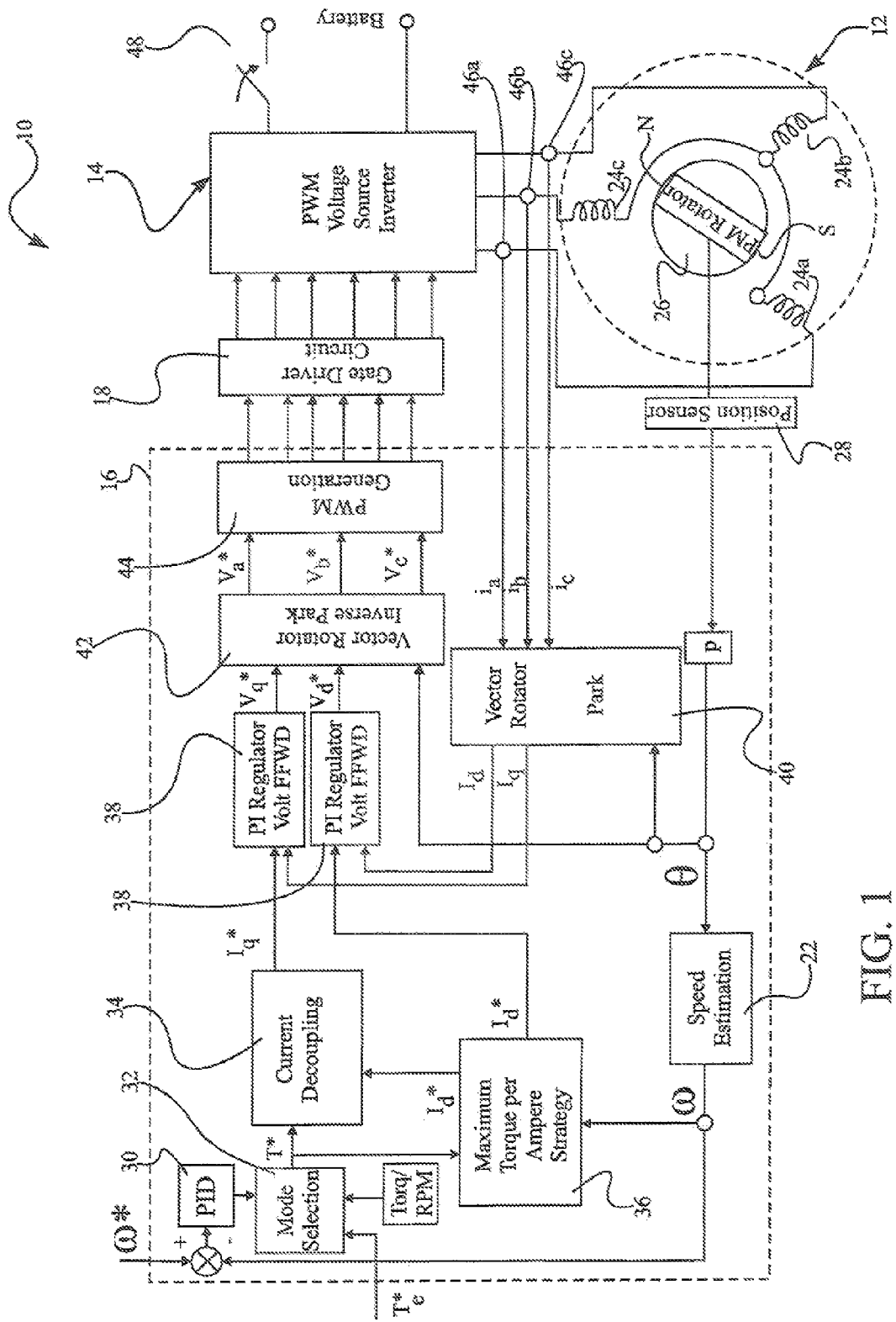
FIG. 1 is a schematic of an electric traction motor controller using a vector control technique.

Referring more specifically to FIG. 1, a motor control system 10 is capable of using current decay transients to perform torque shut-off path checks at key on without physically spinning a traction motor. The system 10 includes an electric motor generally shown at 12 that may serve as a traction motor in the hybrid electric vehicle and a PWM voltage source inverter generally shown at 14 to provide controlled electric power with variable magnitude and frequency shown to the electric motor 12. A motor controller 16 controls the operation of the inverter 14 by issuing PWM duty-cycle commands to a gate driver circuit 18 and thus controls the on and off of inverter 14 and therefore the input electric power to motor 12.

Figure 2:
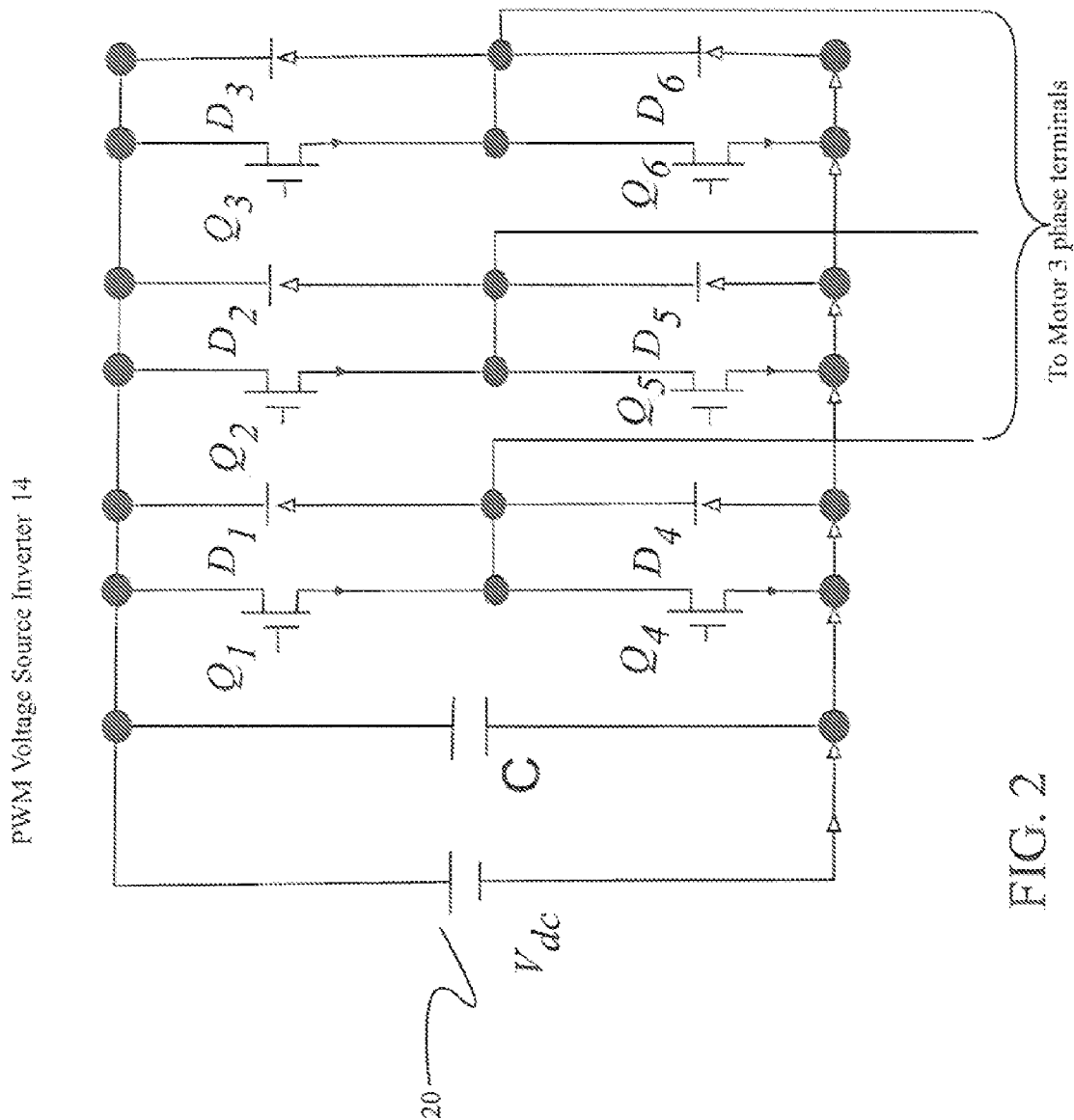
FIG. 2 is a schematic of a power electronics inverter for the controller of FIG. 1.

As shown in FIG. 1 and more specifically in FIG. 2, the PWM voltage source inverter 14 is used to provide variable magnitude and variable frequency electric power to the traction motor 10. In the inverter 14, power electronic switches, diodes and capacitors in various organizations may be used. As shown in FIG. 2, the inverter 14 may use respective freewheeling diodes D1, D4, D2, D5, D3, D6 that are connected in reverse parallel with the power electronics switches Q1, Q4, Q2, Q5, Q3, Q6. The power electronics switches Q1-Q6 can be any suitable switching devices, such as IGBTs, MOSFETs, or any other suitable power semiconductor or transistor devices. Those skilled in the art will recognize that the power electronics switches Q1-Q6 can include integrated freewheeling diodes, instead of having the freewheeling diodes D1-D6 provided separately. A filter capacitor C may be placed in parallel with a DC voltage source 20 that supplies DC electricity to the inverter 14. The DC voltage source 20 may be one or more DC batteries, fuel cell(s), generator(s), power converter(s) or the like. In a preferred embodiment, the output of inverter 14 directly connects to the motor 12 and is linked to a motor controller 16 via the gate circuit driver 18.

The electric motor 12 can be any suitable type of three-phase AC electric machine such as three-phase induction machines, reluctance machines, or synchronous and permanent magnet synchronous machines. Additionally, as an electromagnetic conversion device, the motor 12 may convert electric energy from the inverter 14 to mechanical kinetic energy to the output shaft or alternatively may convert mechanical kinetic energy from motor movement back into electrical energy. In its preferred embodiment, the motor 12 is shown with its three phase windings 24a, 24b, 24c and a rotor 26 having magnetic poles N, S in rotational proximity to the windings 24a, 24b, 24c. Each of the phase windings 24a, 24b, 24c are connected through the phases A, B, C to the inverter 14 that powers the motor 12.

The motor controller 16 may be used to control the inverter 14 and render the optimum torque or speed control output from the motor 12. For example, the motor controller 16 governs the performance of the electric motor 12 for delivering the applied torque $T_c^*$, delivering the motor speed ($\omega$) or a combination of the two by employing maximum torque-per-ampere vector control strategy. The controller 16 may accomplish this task using several tools and can include any suitable processor(s) configured to execute control logic that may control the inverter 14 and the motor 12.

The motor controller 16 may be interfaced with any suitable memory, which can include any medium configured to provide at least temporary storage of data and/or software or instructions that provide at least temporary storage of data and/or software or instructions that provide at least some of the functionality of the switching and that data may be executed by the controller 10. The motor controller 16 sends PWM generation 44 duty-cycle commands to the gate driver circuit 18 on the high voltage side. Pulse Width Modulation, or PWM generation 44 may be effectuated using semiconductor switches such as MOSFETs or BJTs arranged as required in each application. The gate driver 18 amplifies the received PWM generation 44 duty-cycle commands and sends them to the appropriate gate pins of the corresponding power switches in the inverter 14 to energize the corresponding motor phases.

The controller 16 may also include any other suitable devices or modules, such as ancillary devices like clocks, power supplies, and the like. Moreover, any other suitable devices can be placed in communication with the controller 16, such as one or more sensor(s), other controllers, or the like.

In an exemplary embodiment, the motor controller 16 calculates the motor speed ($\omega$) via a speed estimation algorithm 22. The speed estimation algorithm 22 calculates the speed ($\omega$) using the change in motor position ($\theta$) as indicated by a position sensor 28 attached to the motor 12 in relation to time. Actual speed values calculated using data from the position sensor 28 are fed, together with a desired speed ($\omega^*$), to a PID controller 30. The PID controller 30 is preferably implemented using software, but could be effected using any suitable means. The PID controller 30 then outputs the torque required in order to regulate the actual motor speed to the desired speed.

The motor controller can be in torque control mode or speed control mode as determined by the mode selection block 32, which takes the inputs from the torque output of the PID controller 30 along with the torque command signal $T_e^*$ from a vehicle system controller as is commonly used in a hybrid electric vehicle. The mode selection output is the desired torque signal $T^*$ that may satisfy either a torque command request or regulate the motor speed to commanded set points. A current decoupling algorithm 34 receives the desired torque signal $T^*$ as well as a desired direct-axis current $I_d^*$. The mode selection block 32 is preferably implemented using a software algorithm, but also may be implemented using any device capable of digital logic. From the mode selection block 32, the desired torque signal $T^*$ may be used for two operations, a current decoupler block 34 and a maximum torque per ampere strategy 36.

At the current decoupler 34, the desired quadrature-axis current $I_q^*$, is generated from both desired torque $T^*$ and the desired direct-axis current $I_d^*$. Using a formula such as $T=3/2[p/2(\lambda pm+(Ld-Lq)Id]Iq$ where $\lambda_{pm}$ equals PM flux linkage, p equals the number of motor poles, $L_d$ equals direct-axis inductance and $L_q$ equals quadrature-axis inductance, the desired quadrature-axis current $I_q^*$ may be calculated.

The desired direct-axis current $I_d^*$ may be generated using the maximum torque-per-ampere strategy 36. Often, it is desirable to control the motor with the smallest amount of current feasible. Therefore, the controller 16, through the maximum torque-per-ampere strategy block 36, calculates a point where current is minimized for a particular speed and torque. The minimized desired direct-axis current, $I_d^*$, may be sent to both the current decoupling block 34 for calculating the desired quadrature-axis current, $I_q^*$ and the PI regulator 38 for regulating motor d-axis current to desired value, $I_d^*$.

The desired quadrature-axis current $I_q^*$ and desired direct-axis current $I_d^*$ are sent to PI regulators 38 from the current decoupler 34 and the maximum torque block 36 respectively for current regulation. The PI regulators 38 are another form of PID controller that compare the desired currents, $I_d^*$ and $I_q^*$ with the quadrature and direct-axis currents, $I_q$ and $I_d$. The PI regulators 38 generate a desired voltage, $V_q^*$ and $V_d^*$, to regulate the measured quadrature-axis current $I_q$ and the measured direct-axis current $I_d$ to the desired quadrature-axis current $I_q^*$ and the desired direct-axis current $I_d^*$.

A Park's transformation block 40 converts motor currents $i_a, i_b, i_c$ in the three-phase windings 24a, 24b, 24c of the motor 12 using Park's transformation, to the direct-axis current $I_d$ and the quadrature-axis current $I_q$. Using the transformed direct-axis current $I_d$, the desired direct-axis current $I_d^*$, the transformed quadrature-axis current $I_q$ and the desired quadrature-axis current $I_q^*$, the PI regulators 38 generate the desired quadrature-axis voltage $V_q^*$ and the desired direct-axis voltage $V_d^*$ to regulate $I_d$ and $I_q$ to their set point values. The desired direct-axis voltage $V_d^*$ and the desired quadrature-axis voltage $V_q^*$ are output by the regulators 38 and are sent to a vector rotator Park transformation block 40.

Using the desired quadrature-axis voltage $V_q^*$ and the desired direct-axis voltage $V_d^*$, a vector rotator inverse Park block 42 converts the desired quadrature-axis voltage $V_q^*$ and the desired direct-axis voltage $V_d^*$ into the desired three-phase voltage. The inverse Park's transformation block 42 converts the desired quadrature-axis voltage $V_q^*$ and the desired direct-axis voltage $V_d^*$ into desired three-phase voltages, $V_a^*, V_b^*$ and $V_c^*$. These three voltages $V_a^*, V_b^*$ and $V_c^*$ are the voltages needed at the motor three phase terminal to achieve the desired currents and may be used for PWM generation 44 and outputted into the gate driver circuit 18. Both the vector rotator inverse Park transformation block 42 and the vector rotator Park transformation block 40 may be effectuated using computer software or any other algorithm suitable for carrying out mathematical calculations.

Current measuring devices 46a, 46b, 46c are placed around the phases A, B, C between the motor 12 and the inverter 14, or placed in any other suitable location such as inside the motor 12 or inverter 14. The devices 46a, 46b, 46c may take the form of ammeters, current sensors or any other suitable instruments that can be connected to the phases A, B, C via any suitable means for sensing motor phase currents in phases A, B, C. As shown in FIG. 1, the phase currents measured by devices 46a, 46b, 46c are sent to the controller 16 in any suitable manner, such as A/D channels via signal conditioning circuits.

Figure 3:
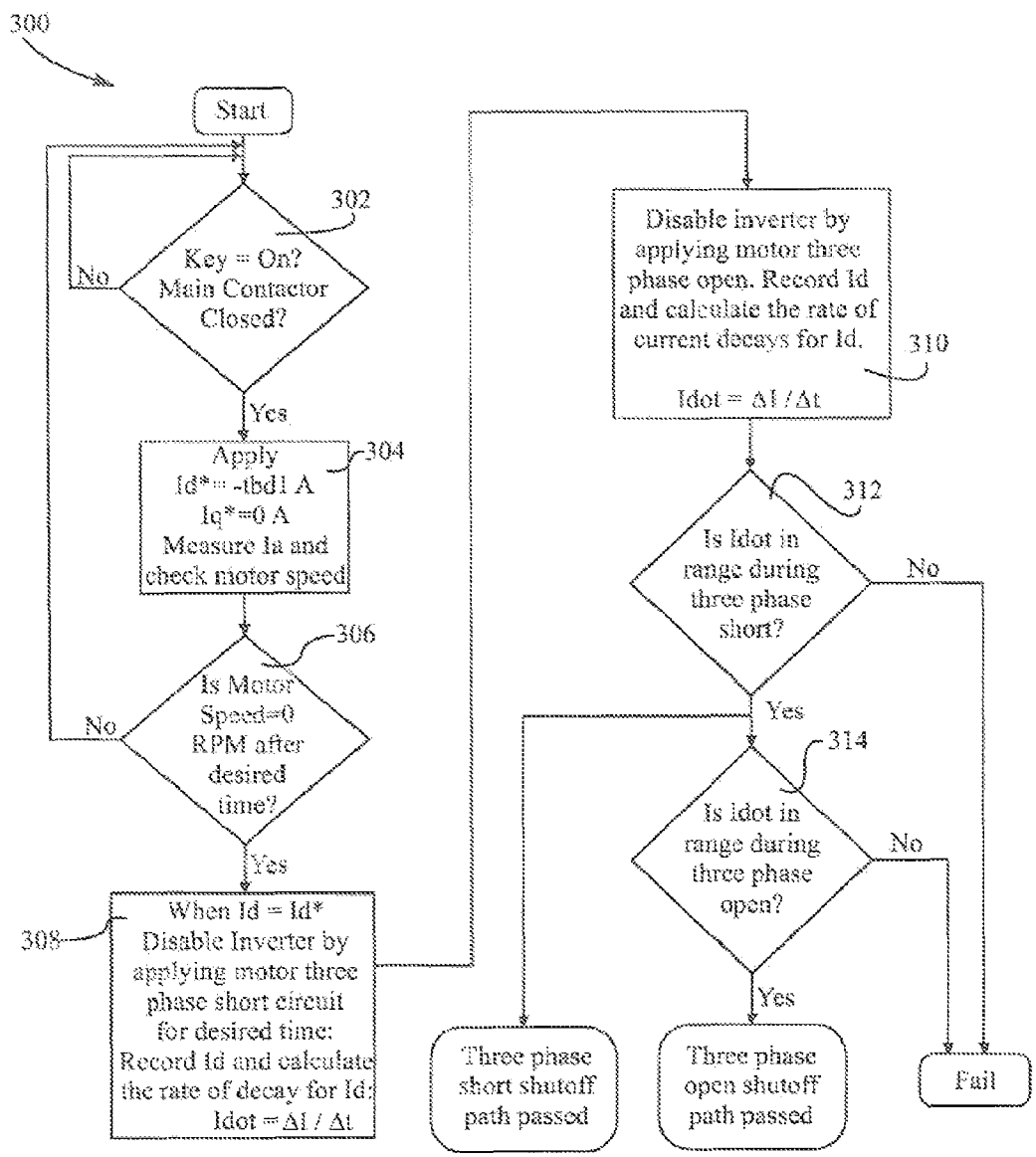
FIG. 3 is a flow chart of a method of testing effectiveness of an electric motor shut-off path.

FIG. 3 illustrates an exemplary method of testing the shut-off path of an electric motor wherein the testing is carried out without spinning the electric motor. The method 300 may be carried out using any suitable means such as the system 10 shown in FIG. 1.

The method 300 begins at step 302 which includes ensuring that a main contactor 48 is closed before proceeding further. For example, if the contactor 48 attached to the inverter 14 is closed, then electric power to the motor control systems 10 is engaged and the method proceeds to step 304. If the contactor 48 is not closed and electric power to the system 10 is not engaged then the method stops until the contactor 48 is successfully closed.

At step 304, if it is determined the main contactor 48 is closed in step 302, then two currents are applied to an electric motor 12 along two axes and current in one of the phases is measured. First, for example, two currents, $I_d$ and $I_q$ may be generated by transforming a DC current applied to one of the three motor phases A, B, C using Park's transformation. The first current, $I_d$ may be a non-zero amount of current injected by the inverter along a d-axis that may be alternatively named the direct axis. The d-axis is an arbitrary axis measured on the same plane as the spinning rotor 26 of the electric motor 20. The second current, $I_q$ may be a substantially-zero amount of current that may be injected by the inverter 10 along a q-axis. The q-axis may be called the quadrature axis and is an arbitrary axis measured on the same plane as the spinning rotor of the electric motor 12 and is additionally perpendicular to the d-axis. The current values vary by application, and the motor controller 16 regulates the amount of current respectively injected. For example, the motor 12 can be injected with $I_d=-50$ A and $I_q=0$ A and current in one phase of an electric motor 12 may be measured by using current sensors, 46a, 46b, or 46c. When $I_q=0$ A, the rotor will not rotate due to the non-torque producing nature of this particular current injection. For instance, the current sensor 46a in phase A may be used to determine the current in phase A, $I_d$, which may then be recorded for future use. The current value $I_d$ may be recorded in the motor controller 16 or any other device capable of data storage. Thereafter, the method proceeds to step 306.

At step 306, motor speed (ω) may be verified as being substantially zero. For example, the motor speed (ω) should be substantially zero by injecting the first and second currents, $I_d$ and $I_q$, at points ninety degrees from each other. Injecting currents at these locations should ensure that the torque generated on the rotor 26 of the motor 12 is substantially zero. The motor speed (ω) may be verified as substantially zero in any suitable manner. For example, the motor rotor 26 can be verified as substantially stationary by monitoring any movement using a position sensor 28 on the rotor shaft. The position sensor 28 can be any suitable sensor such as a motor resolver or the like. If the motor speed (ω) is not substantially zero, then the method loops back to begin step 302 again. Otherwise, the method proceeds to step 308.

At step 308, when a measured current substantially equals a first injected current, an inverter is disabled by short-circuiting the three motor phases and the rate of current decay is measured. For example, a three-phase motor short may be applied for a limited duration. This duration may vary depending on application but an exemplary value may be about 20 milliseconds. Disabling the inverter 14 may be accomplished by turning on all three lower legs of the IGBT power switches, Q4, Q5, Q6. Phase A current, $I_d$, may then be recorded by sampling and storing data from the output $I_d$ taken from the vector rotator park transformation 40. The rate of current decay in phase a current may be calculated using the formula $I_{dot\ldots}s=\Delta I/\Delta t$. At this time the method proceeds to step 310.

At step 310, an inverter is disabled by applying a three-phase motor open for a limited duration. This may be accomplished by opening all IGBT power switches of the inverter 14. Current in phase A, $I_d$, is recorded as described earlier, and a rate of current decay in a motor phase is calculated according to $I_{dot\ldots}o=\Delta I/\Delta t$. Once the current decays for the three-phase short and three-phase open are calculated in steps 308 and 310, the method proceeds to step 312.

At step 312, the calculated current decay during a three-phase inverter short may be compared against predetermined criteria previously stored. For example, the predetermined criteria can include one or more current decay values or range of values that may be stored in external memory, the motor controller 16 or any other device that contains memory capable of storing numerical values. The predetermined criteria may be one or more threshold values wherein if the rate of decay is greater than or equal to a threshold value than the step passes. Alternatively, the criteria could be a range of values wherein if the rate of decay is within a certain range then the step passes. As injected current $I_d$ decays from, for example, −50 A to 0 A during a three-phase short, a preferable current decay value may be within a range of about 50-75 mS. Comparing the measured current decay value against the stored current decay values may be accomplished using logic gates, a subroutine of an existing software program or any other suitable algorithm. If the current decay value measured during the three-phase short does not meet the predetermined decay criteria then three-phase shut-off path check fails and the method ends. If the current decay value measured during the three-phase short does meet the predetermined decay criteria then the three-phase short shut-off path check passes and the method progresses to step 314.

At step 314, the current decay value calculated during a three-phase inverter open may be compared to predetermined decay criteria. For example, the predetermined criteria can include one or more values or a range of values. A preferable rate of current decay value $I_{dot}$ as injected current $I_d$ decays from, for example, −50 A to 0 A may be approximately 0.1 mS during a three-phase open. If the current decay value meets the predetermined decay criteria, then the three-phase short shut-off path check passes and the method ends. If the current decay value measured during the three-phase open does not meet the predetermined decay criteria then the shut-off path check fails and the method ends. The steps 312 and 314 can be reversed if desired.

While certain preferred embodiments have been shown and described, persons of ordinary skill in this art will readily recognize that the preceding description has been set forth in terms of description rather than limitation, and that various modifications and substitutions can be made without departing from the spirit and scope of the invention, as set forth in the following claims.

What is claimed is:

1. A method of testing automotive vehicle electric traction motor shut-off paths, the method comprising the steps of:
   providing a three-phase electric motor having at least one shut-off path that is an electric traction motor of an automotive vehicle, a source of electric current, a current injection circuit connected to the source of electric current and to the three-phase electric motor, and current measurement circuitry and electrical communication with the three-phase electrical motor;
   injecting current into the three-phase electric motor;
   applying at least one of a short or an open to the three-phase electric motor for a predetermined length of time;
   calculating a rate of decay of the current;
   comparing the rate of decay wit predetermined decay criteria; and
   determining that testing of the at least one shut-off path of the three-phase electric motor has passed if the rate of decay meets the predetermined decay criteria and that the at least one shut-off path has failed if the rate of decay does not meet the predetermined decay criteria.

2. The method of claim 1 wherein a contactor is provided between the source of electric current and the current injection circuit; and further comprising checking whether the contactor is closed such that the vehicle key is on before the current is injected.

3. The method of claim 1 wherein a position sensor operatively coupled to the electric traction motor is provided, and further comprising verifying that motor speed is substantially zero using the position sensor before carrying out the applying step.

4. The method of claim 1 wherein the current injection circuit comprises at least one of a three-phase inverter and a motor controller, and further comprising injecting current into the electric motor using the three-phase inverter.

5. The method of claim 1 further comprising measuring current in at least one phase of the three-phase motor.

6. The method of claim 1 wherein the injected current is a substantially zero-amp current in accord with a first axis.

7. The method of claim 1 wherein the injected current is substantially non-zero amp current in accord with a second axis.

8. The method of claim 1 further comprising determining that the injected current is substantially the same as the measured current after the injecting step.

9. The method of claim 1 wherein during the applying step both a short circuit and an open circuit is applied to the three-phase electric motor, wherein during the calculating step, calculating a first rate of current decay during one of the short circuit and open circuit and calculating a second rate of current decay during the other one of the short circuit and open circuit, wherein during the comparing step the first rate of current decay and second rate of current decay are compared with predetermined decay criteria, and wherein during the determining step determining that the at least one shut-off path has passed if the first and second rate of current decay meet the predetermined decay criteria and determining that the at least one shut-off path has failed if either one of the first and second rate of current decay does not meet the predetermined decay criteria.

10. A method of diagnosing faults in an automotive vehicle electric motor deactivation device, the method comprising the steps of:
  providing a three-phase electric motor having at least one shut-off path that comprises an electric traction motor of an automotive vehicle, a source of electric current, a three-phase inverter connected to the source of electric current and connected to three-phase electric motor, an electric motor position sensor, and a motor controller in electrical communication with the three-phase electric motor;
  injecting current into the three-phase electric motor using the three-phase inverter while the motor speed is substantially zero;
  disabling the inverter for a predetermined length of time;
  calculating a rate of current decay; and
  comparing the rate of current decay with predetermined decay criteria.

11. The method of claim 10 further comprising providing a main contactor between the source of electric current and the three-phase inverter; and checking whether the main contactor is closed before the current is injected indicating that the automotive vehicle key is on.

12. The method of claim 10 further comprising verifying that motor speed is substantially zero before carrying out the calculating step.

13. The method of claim 10 further comprising injecting current into the electric motor using a three-phase inverter.

14. The method of claim 10 wherein the injected current is a substantially zero-amp current in accord with a first axis $L_d$.

15. The method of claim 10 wherein the injected current is a substantially non-zero amp current in accord with a second axis $L_q$.

16. The method of claim 10 further comprising measuring current in at least one phase of the three-phase motor.

17. The method of claim 10 further comprising determining that the test passed if the current decay is within a predetermined range.

18. A method for checking an automotive vehicle electric motor deactivation device, comprising the steps of:
  providing a three-phase electric motor that is an electric traction motor of an automotive vehicle, a source of electric current, a current injection circuit connected to the source of electric current and connected to the three-phase electric motor that comprises a three-phase inverter and a motor controller in electrical communication with the three-phase electric motor, an electric motor rotor sensor, and a contactor between the source of electric current and the current injection circuit;
  checking whether the contactor is closed before current is injected;
  injecting current into the three-phase electric motor where the current is insufficient to cause motor rotation and includes a non-zero amp direct-axis current and a substantially zero amp quadrature axis current;
  measuring current in at least one phase of the three-phase motor;
  verifying that electric motor speed is substantially zero;
  applying a three-phase short to the three-phase electric motor for a predetermined length of time;
  calculating a first current decay as a result of the application of the three-phase short;
  comparing the first current decay with a current decay criteria;
  applying a three-phase open to the electric motor for another predetermined length of time;
  calculating a second current decay as a result of the application of the three-phase open;
  comparing the second current decay with another current decay criteria; and
  determining that the three-phase electric motor has passed if the first current decay meets the current decay criteria and the second current decay meets the another current decay criteria and has failed if either the first current decay does not meet the current decay criteria or the second current decay does not meet the another current decay criteria.

19. The method of claim 18 including injecting current into the electric motor using the three-phase inverter.

20. The method of claim 18 including injecting DC current into the electric motor and wherein the automotive vehicle comprises a hybrid vehicle.

* * * * *